(12) United States Patent
Rumer et al.

(10) Patent No.: US 6,982,492 B2
(45) Date of Patent: Jan. 3, 2006

(54) NO-FLOW UNDERFILL COMPOSITION AND METHOD

(75) Inventors: Christopher L. Rumer, Chandler, AZ (US); Tian-An Chen, Phoenix, AZ (US); Vijay Wakharkar, Phoenix, AZ (US); Paul A. Koning, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 92 days.

(21) Appl. No.: 10/692,062

(22) Filed: Oct. 23, 2003

(65) Prior Publication Data

US 2005/0087891 A1   Apr. 28, 2005

(51) Int. Cl.
*H01L 23/48*   (2006.01)
*H01L 23/52*   (2006.01)
*H01L 29/40*   (2006.01)

(52) U.S. Cl. ...................................... 257/783; 257/782

(58) Field of Classification Search ................ 257/782, 257/783, 780, 781, 787
See application file for complete search history.

(56) References Cited

U.S. PATENT DOCUMENTS

| | | | |
|---|---|---|---|
| 5,804,882 A * | 9/1998 | Tsukagoshi et al. | 257/783 |
| 6,221,691 B1 * | 4/2001 | Schrock | 438/106 |
| 6,806,581 B2 * | 10/2004 | Hsieh | 257/782 |
| 6,844,052 B2 * | 1/2005 | Jiang | 428/209 |
| 6,903,463 B1 * | 6/2005 | Takeichi et al. | 257/778 |

* cited by examiner

*Primary Examiner*—S. V. Clark
(74) *Attorney, Agent, or Firm*—Buckley, Maschoff & Talwalkar LLC

(57) ABSTRACT

In some embodiments, a method includes providing a composition which includes a base at least partially filled with filler particles and applying the composition as an underfill composition. At least some of the filler particles are electrically conductive.

12 Claims, 7 Drawing Sheets

NO-FLOW UNDERFILL COMPOSITION AND METHOD

BACKGROUND

According to the well-known "flip chip" integrated circuit mounting or packaging technique, an integrated circuit (IC) die is mounted in inverted fashion on a substrate, with solder bumps or other connection bumps on the face of the IC die bonded directly to solder connections on the substrate. It has been found that the useful life of the die/substrate assembly can be increased by providing a so-called "underfill" encapsulant to encapsulate the electrical connections between the die and the substrate. In most commercial flip chip manufacturing processes, a so-called "capillary" underfill is employed. With capillary underfill, the encapsulant is allowed to flow between the die and the substrate after the die bumps have been bonded to the substrate connections.

There are some concerns that the process step of applying capillary underfill may be excessively time-consuming, and so may become a bottleneck in the overall IC board or package manufacturing process. In an attempt to provide faster application of underfill, a so-called "no-flow" underfill process has been proposed in which underfill is applied to the substrate and/or to the die face before the die is bonded to the substrate. The no-flow underfill is displaced from the locus of the die/substrate electrical connections as a part of the bonding process.

One important characteristic of an underfill material is its coefficient of thermal expansion (CTE). Ideally the CTE of the underfill is close to the CTE of the electrical joint between the die and substrate. If the CTE of the underfill is substantially higher than that of the electrical joint, the joint may be stressed during thermal cycling and may experience joint fatigue, possibly leading to cracking and early failure.

Typical capillary underfill compositions are formed of a base (e.g., an epoxy system) having a relatively high CTE, filled with low-CTE filler particles (e.g. silica) to bring the overall CTE of the composition down to a desirable value. To achieve the desired low overall CTE, the degree of silica loading may be on the order of 60% to 65% by volume. However, such highly loaded materials have not proven to be satisfactory for use as no-flow underfills (i.e., for an underfill applied to a substrate or die before the die is bonded to the substrate), since, with a high degree of filler loading, filler particles may be trapped in the electrical joints, thereby possibly compromising the electrical connections between the die and substrate. This difficulty is not presented with capillary underfill, of course, since capillary underfill is applied after the electrical joint has been formed.

There accordingly is a problem as to how a no-flow underfill can be provided that has a suitably low CTE but will not interfere with joint formation between the IC die and the substrate. Interference with joint formation can be alleviated by reducing the degree of filler loading, but only with the disadvantage of higher underfill CTE, leading to possible reduction in useful life for the IC.

DETAILED DESCRIPTION

Figure 1:
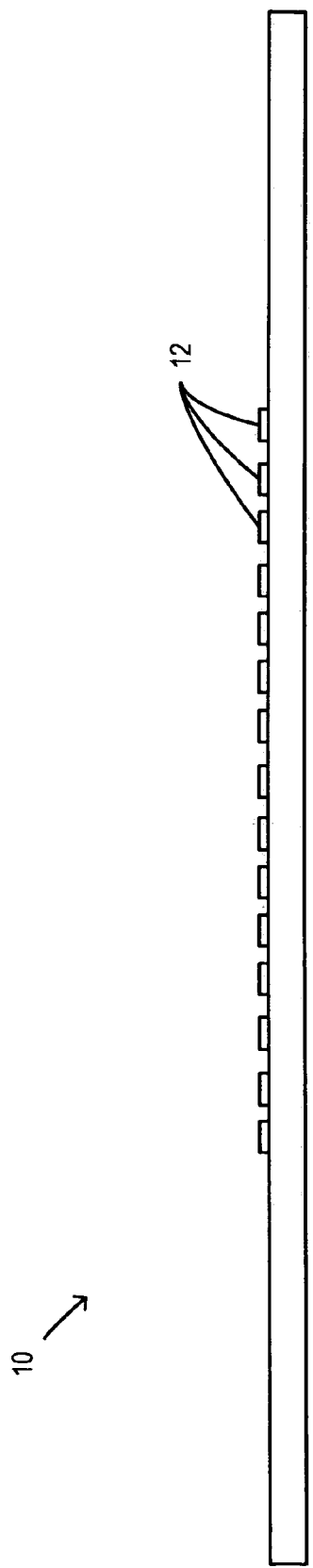
FIG. 1 is a schematic side cross-sectional view of a substrate to which an IC die may be bonded, according to some embodiments.

According to some embodiments, a no-flow underfill composition may be formed of an encapsulant base filled (i.e., at least partially filled or loaded) with filler particles of which some particles are electrically conductive. In some embodiments, all of the filling of the underfill composition may be with conductive particles (i.e., there are substantially no non-conductive particles in the composition in these embodiments). In other embodiments, both conductive and non-conductive particles are used to fill the underfill composition.

As used herein and in the appended claims, "electrically conductive particles" include particles that are entirely of an electrically conductive material, as well as particles formed of a non-conductive material with a conductive coating and particles of a conductive material with a non-conductive coating. A "coating" includes but is not limited to a layer of oxidized material, as well as a layer applied to a particle by dipping, spraying and the like, or any other covering layer.

In some embodiments, if only conductive particles are used to fill the underfill material, the proportion of filler particles in the composition may be limited to 30% by volume or less as predicted by percolation theory of spherical particles. If more than 30% conductive filler particles are employed, in the absence of non-conductive filler, there may be an increased risk of electrical shorting or leakage through the underfill between adjacent die/substrate connections. In some embodiments, the proportion of filler particles in the composition may be in the range of 10% to 30% by volume if all of the filler particles are conductive.

In other embodiments, in which both conductive and non-conductive fillers are employed, the proportion of non-conductive filler particles may range up to about 50% by volume of the composition and the proportion of conductive filler particles may range up to about 40% by volume of the composition, with the combined filler loading up to about 60–65% by volume. In some embodiments, the proportion of non-conductive filler particles may be limited to 40% of the composition by volume and the proportion of conductive filler particles may be limited to 30% of the composition by volume, with the combined filler loading up to 60–65% by volume. In some embodiments, the proportion of non-conductive filler particles may be in the range of 20% to 40% by volume of the composition, with the proportion of conductive filler particles in the range of 10% to 20% by volume of the composition.

In some embodiments, the amount of loading of the underfill material with non-conductive fillers may be at a level just below a level at which interference with joint integrity may be experienced, with additional loading with conductive fillers to a sufficient extent to lower the CTE of the underfill material to a desired value.

In some embodiments, the conductive particles may be formed of an elemental metal, a metal alloy or a solder alloy. The conductive particles may be formed of one or more of the following metals: copper, silver, aluminum, gold, platinum, palladium, beryllium, rhodium, nickel, cobalt, iron, molybdenum, tin, lead, chromium, zinc, magnesium, titanium, bismuth, cadmium, gallium, indium, mercury, antimony, scandium and polonium. Particular examples of materials that may be used for conductive particles in some embodiments include, tin based solders, silver fillers and/or aluminum fillers.

Other examples of conductive particles that may be employed in some embodiments include metal-coated particles and/or solder-coated particles, including coated particles of the type employed in production of anisotropic films.

Still other conductive fillers that may be employed in some embodiments include carbon black, antimony oxide, fibers coated with conductive elements, nano-fillers, zinc oxide whiskers, filamentary and whisker forms of nickel, and silver oxide. As used herein, "nano-fillers" refers to one or more of the following: nanocircuits, nanowires, nanodevices and nanotubes. As used herein, "nanotubes" refers to hollow carbon cylinders with a diameter on the scale of nanometers. Nanotubes that may be used as conductive fillers in some embodiments may be doped with conductive atoms; in some cases the dopants may be inside the tube to provide a unique pathway for electron mobility. Examples of nanotubes that may be suitable as conductive fillers in some embodiments are single-walled carbon nanotubes (SWCN) and tungsten disulfide nanotubes.

If non-conductive filler particles are included in the underfill composition, the non-conductive filler particles may be formed of one or more of silica, alumina and boron nitride, for example. In some embodiments, all of the non-conductive filler particles are formed of silica.

In some embodiments the conductive filler particles may have an approximate diameter of less than 15 micrometers, or less than one-fourth of the pitch of the connection bumps on the IC die. In some embodiments, the non-conductive filler particles, if present, may have a diameter of less than 40 micrometers.

In some embodiments, which include non-conductive as well as conductive filler particles, the non-conductive filler particles may include both relatively small non-conductive filler particles having a diameter in the range of 1 to 5 micrometers and relatively large non-conductive filler particles having a diameter in the range or 5 to 25 micrometers, with the conductive filler particles having a diameter of less than 10 micrometers.

In some embodiments, the base of the underfill composition may include a low viscosity epoxy resin (such as diglycidylether of bisphenol F, or diglycidylether of bisphenol A), a low viscosity hardener (such as an anhydride (e.g., methylhhexahydrophthalic anhydride), or an amine (e.g., an aromatic amine), or a multifunctional phenolic resin, or a novalac (e.g., a phenolic novalac or a cresolic novalac)), and a low viscosity cyanate ester.

In some embodiments, the base of the underfill composition includes diglicidylether of bisphenol F with anhydride hardener such as methylhexahydrophthalic anhydride.

FIG. 1 is a schematic side cross-sectional view which shows a substrate 10 having solder bumps 12 formed thereon. The substrate 10 may be, for example, a circuit board to which an IC die (not shown in FIG. 1) is to be directly connected, or the substrate may be a portion of a package for the IC die. The substrate 10 may be constructed in accordance with conventional practices.

Figure 2:
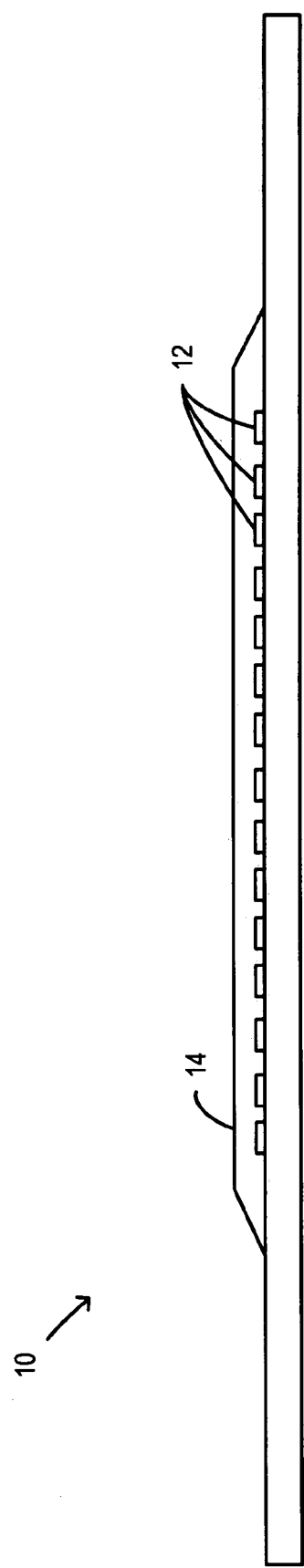
FIG. 2 is a view similar to FIG. 1, showing a no-flow underfill material according to some embodiments applied to the substrate.

FIG. 2 is a view similar to FIG. 1, showing the substrate 10 with a layer of no-flow underfill material 14 applied to the substrate 10 at the locus of the solder bumps 12. The underfill material 14 may have a composition in accordance with one of the embodiments described above, i.e., including at least some conductive filler particles.

Figure 3:
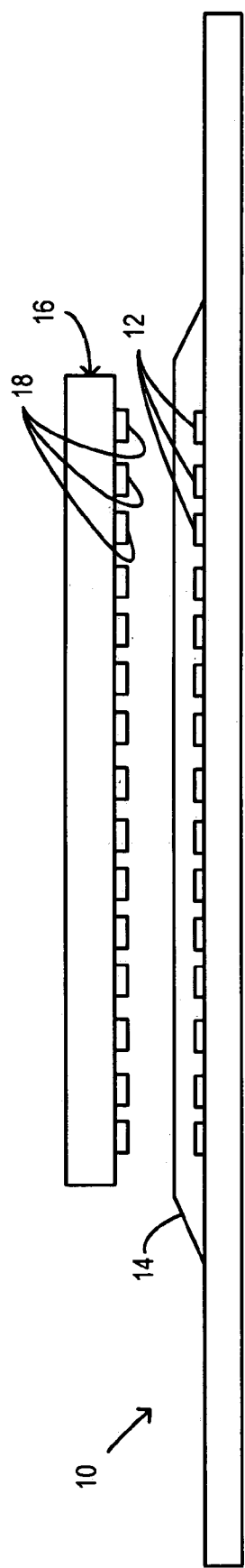
FIG. 3 is a view similar to FIGS. 1 and 2, showing an IC die in juxtaposition with the substrate prior to bonding according to some embodiments.

FIG. 3 is a view similar to FIGS. 1 and 2, but showing in addition an IC die 16 positioned above the solder bumps 12 of the substrate 10. The IC die 16 includes connection bumps 18 to be bonded to the solder bumps 12 of the substrate 10 to form electrical connections between the IC die 16 and the substrate 10. The connection bumps may be formed of solder, in some embodiments, and in other embodiments may be formed of copper. The IC die 16 may be constructed in accordance with conventional practices.

Figure 4:
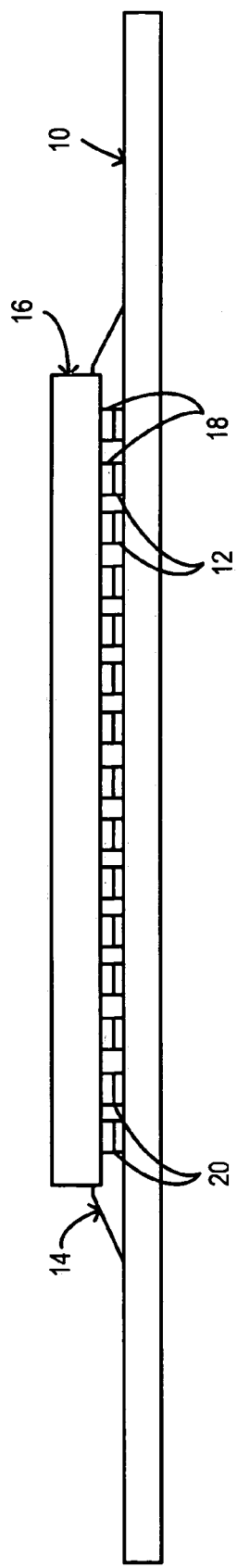
FIG. 4 is a view similar to FIGS. 1–3, showing the IC die bonded to the substrate.

FIG. 4 is a view similar to FIGS. 1–3, showing the IC die 16 bonded to the substrate 10 with electrical connections 20 formed between the IC die 16 and the substrate 10 via the connection bumps 18 of the IC die 16 and the solder bumps 12 of the substrate 10. It will be observed that each of the connection bumps 18 is bonded to a respective one of the solder bumps 12. The no-flow underfill 14 forms a layer between the substrate 10 and the IC die 16 and surrounds (encapsulates) the electrical connections 20.

Except for the composition of the no-flow underfill material 14 (and its effect on the electrical connections 20) the process of bonding the IC die 16 to the substrate 10 may be performed in accordance with conventional practices for a flip-chip bonding process which utilizes a no-flow underfill.

Figure 5:
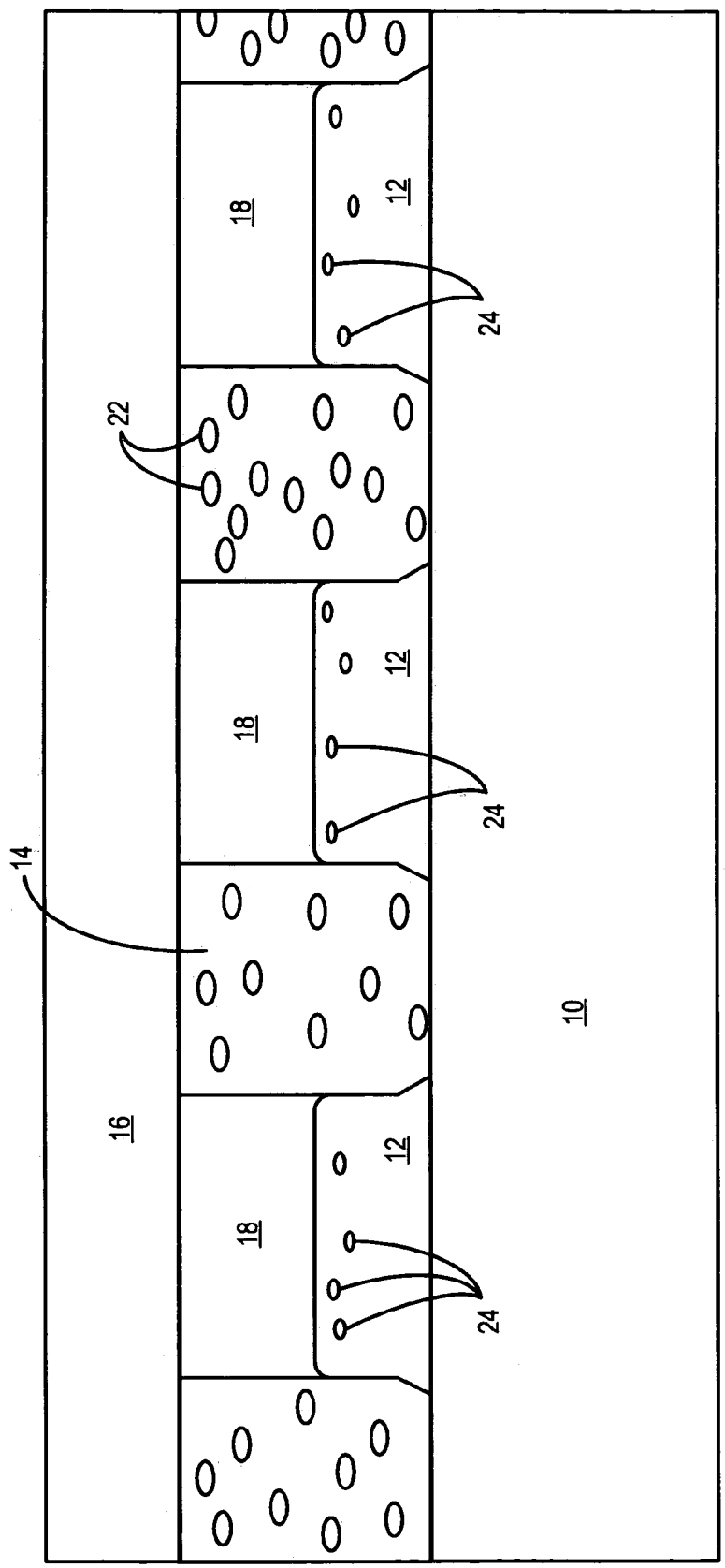
FIG. 5 is a view similar to FIG. 4, but on a larger scale, showing some details of joints and underfill material between the IC die and the substrate.

FIG. 5 is a view that is similar to FIG. 4, but on a larger scale so as to show details of the electrical connections 20 and of the underfill material 14. As seen from FIG. 5, the underfill material 14 is at least partially filled with conductive particles 22. The loading with conductive particles may aid in lowering the CTE of the underfill material to a desired level. Conductive particles that are trapped in the bonding of the connection bumps 18 of the IC die 16 to the solder bumps 12 of the substrate 10 may form intermetallics, as indicated for example at 24, so as to allow reliable electrical connections between the connection bumps 18 and the solder bumps 12.

Figure 6:
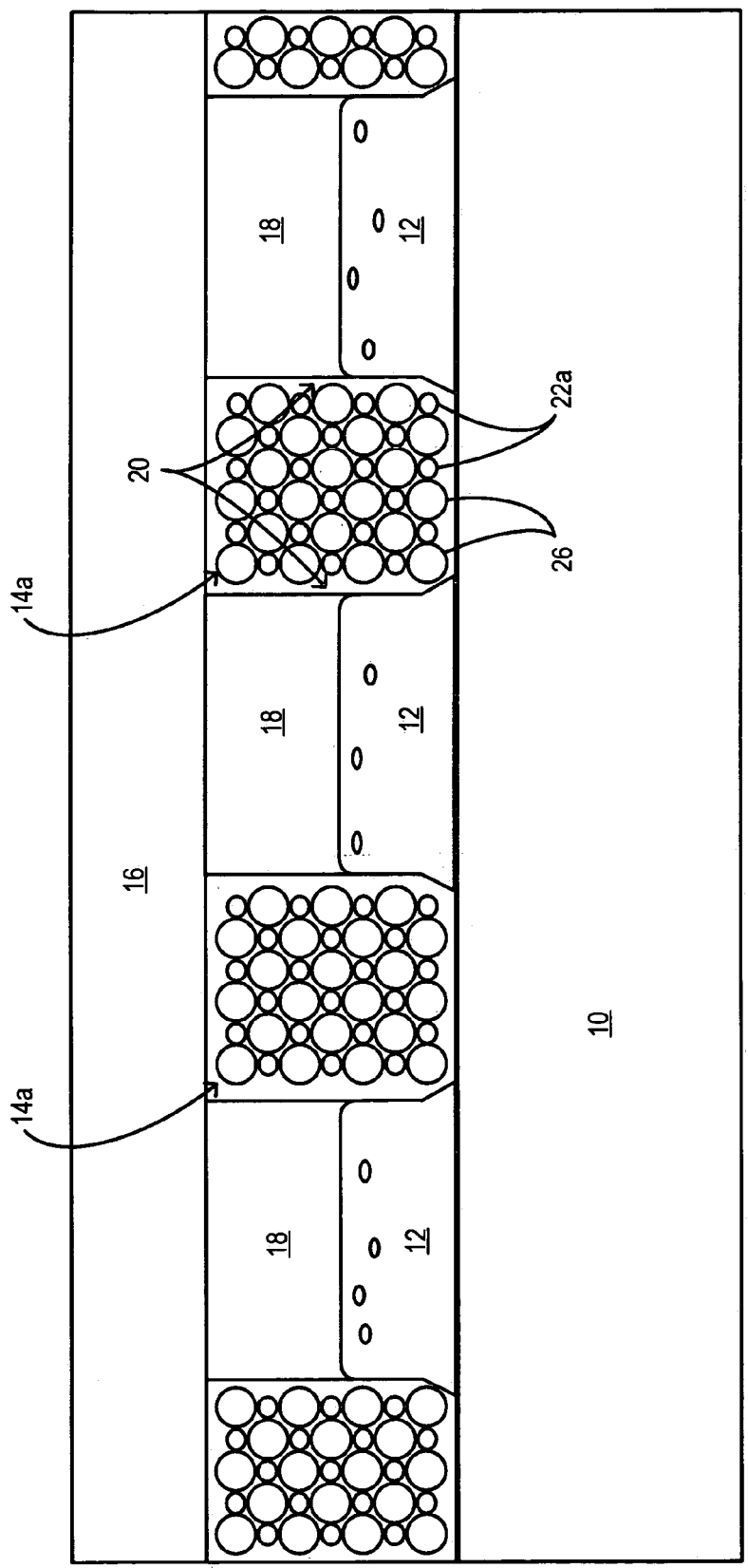
FIG. 6 is a view similar to FIG. 5, but with a no-flow underfill provided according to some other embodiments.

FIG. 6 is a view similar to FIG. 5, but showing a flip chip bonding arrangement which utilizes another embodiment of the underfill material, indicated by reference numeral 14a. The underfill material 14a is highly loaded with both relatively large non-conductive particles 26 and relatively small conductive particles 22a. The presence of the non-conductive particles 26 helps to prevent shorting or leakage between connections 20 due to the presence of the conductive particles 22a, while also aiding in the reduction of the CTE of the underfill material 14a. As in the case of the embodiment of FIG. 5, conductive particles may form intermetallics 24 if trapped between the connection bumps 18 and the solder bumps 12; the intermetallics 24 do not interfere with formation of satisfactory connections 20 between the connection bumps 18 and the solder bumps 12. The degree of loading with non-conductive particles 26 may be low enough so as not to interfere with satisfactory formation of the connections 20, and the relatively large size of the non-conductive particles 26 may aid in preventing the non-conductive particles 26 from being trapped in the connections 20.

Although the embodiments of FIGS. 1–6 are portrayed such that the connection bumps 18 and the solder bumps 12 are substantially square or rectangular in vertical cross section, in other embodiments one or both of the connection bumps 18 and the solder bumps 12 may have tips with a spherical profile, or other profiles, to aid in excluding filler particles (and particularly the non-conductive particles 26) from the connection 20 during the process of bonding the connection bumps to the solder bumps.

In some embodiments, some or all of the conductive particles may be formed of a conductive material with a non-conductive coating. Such a coating may be formed, for example, with an oxidation layer, or a silane coupling agent, or may be formed of a dissolvable polymer. For particles of this kind that are not entrapped in the electrical joint, the non-conductive coating may not be disrupted and the particles may have little tendency to cause shorts or leakage between joints. For the particles of this kind that are entrapped, the pressure applied to the particles during the bonding process may break down the non-conductive coating so that the particles form intermetallics and do not interfere with the integrity of the electrical joint. These embodiments may, but need not, also include non-conductive filler particles such as silica.

In some embodiments, as discussed above, the size of the conductive particles may be small in relation to the space between bumps. This tends to increase the polymer/solder boundaries, thereby reducing the likelihood of shorts or leakage.

In some embodiments, the conductive particles may be formed of a solder material and the underfill base material may be formulated so as to delay the onset of polymer gelling until after the conductive particles have reached the liquid phase. For example, the amount of catalyst in the underfill base material may be reduced as compared to conventional underfill base materials. Alternatively, a latent catalyst (e.g., tetraphenylphosponium tetraphenylborate, imidazole, 2-Ethyl-4-methylimidazole, dicyandiamide, or triphenylphosphine) may be employed and/or the catalyst may be encapsulated. With delayed polymer gelling, the conductive filler particles will tend to form spherical shapes, and conductive filler particles in contact with each other will merge together and be surrounded by the polymer. Electrical contact between the conductive filler and the bumps will tend not to take place if the wetting forces in the polymer exceed the pressure applied to the conductive particles. For the particles not caught between die and substrate bumps, the applied pressure will tend to be relatively low, whereas the particles at the locus of the bumps, which receive high applied pressure, will form intermetallics.

In addition or alternatively, in some embodiments, the underfill base material may be formulated to increase the polymer wetting force to aid in separating the conductive filler particles from each other, thereby decreasing the likelihood of shorts or leakage. In some embodiments, an additive such as an epoxy or amine functional silane coupling agent may be included in the underfill base to increase the polymer wetting force. Other additives that may be employed for this purpose include surfactants such as hydrofluorinated sulfonic acid, nonionic aliphatic acids, etc.

In embodiments described above, the no-flow underfill was applied only to the substrate. However, in other embodiments, the no-flow underfill may be applied to the IC die, or to both the substrate and the IC die.

Figure 7:
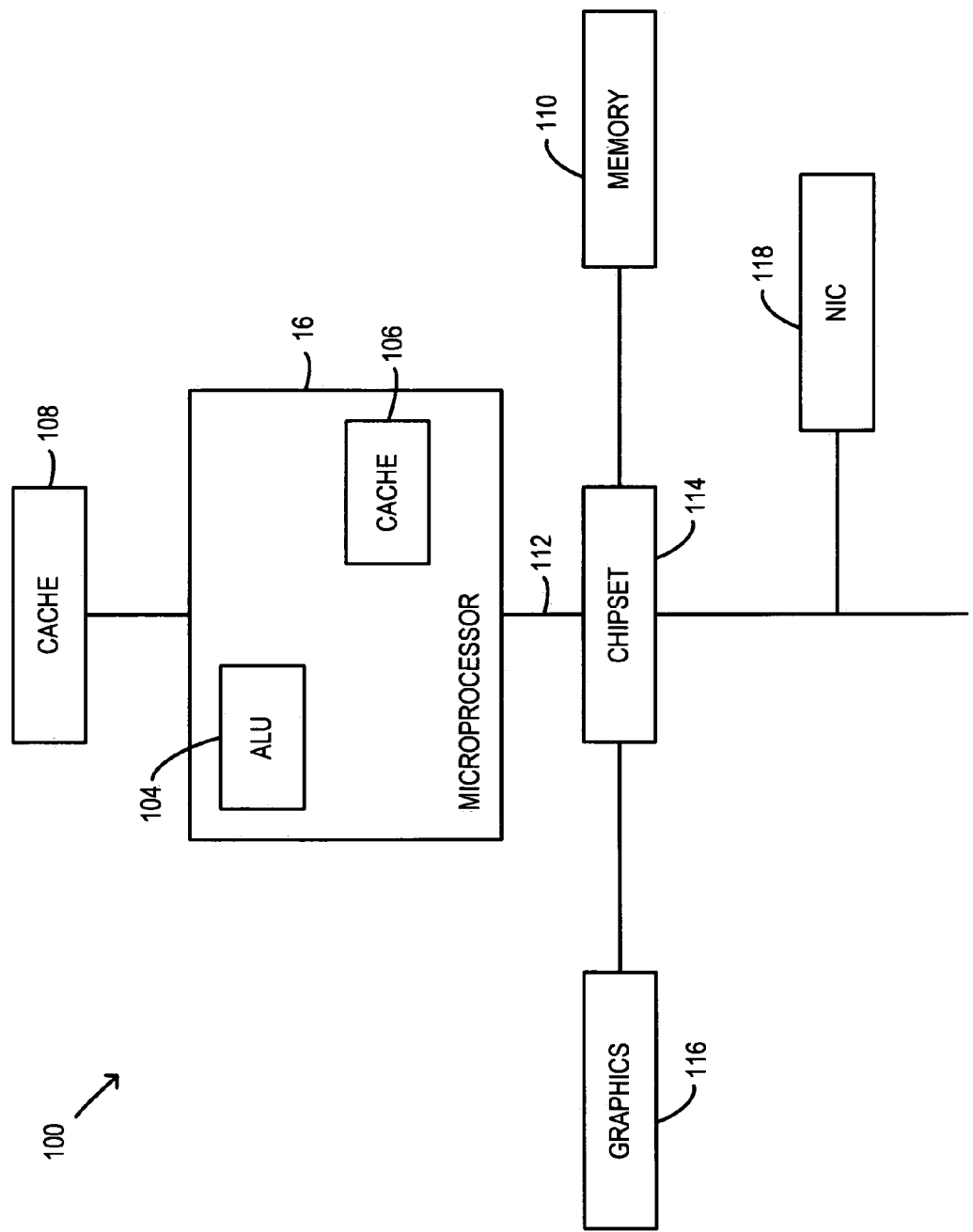
FIG. 7 is a block diagram of a computer system that includes an example of an IC die such as that shown in FIGS. 3–6.

In some embodiments, the IC die 16 may comprise a microprocessor, for example. FIG. 7 is a block diagram that shows a computer system 100 that includes an IC die 16, which comprises a microprocessor, and wherein the die 16 is bonded to a substrate (not-separately shown in FIG. 7) in the presence of a no-flow underfill including conductive filler particles, as described hereinabove. The microprocessor die 16 comprises many sub-blocks, such as arithmetic logic unit (ALU) 104 and on-die cache 106. Microprocessor 16 may also communicate to other levels of cache, such as off-die cache 108. Higher memory hierarchy levels, such as system memory 110, are accessed via host bus 112 and chipset 114. In addition, other off-die functional units, such as graphics accelerator 116 and network interface controller (NIC) 118, to name just a few, may communicate with microprocessor 16 via appropriate busses or ports.

By including at least some electrically conductive filler particles in a no-flow underfill composition, the coefficient of thermal expansion (CTE) of the underfill material may be reduced to a desirable level, while still allowing reliable electrical connection joints to be formed between an IC die and a substrate to which the IC die is bonded by a "flip chip" process. Moreover, inclusion of conductive filler in the underfill material may enhance the thermal conductivity of the underfill, thereby aiding in heat dissipation from the die to the substrate, or in the opposite direction, as the case may be.

Thus, in some embodiments, an encapsulant composition includes an encapsulant base at least partially filled with filler particles, with at least some of the filler particles being electrically conductive.

In other embodiments, a method includes providing a composition which includes a base at least partially filled with filler particles, and applying the composition as an underfill composition, where at least some of the filler particles are electrically conductive.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A device comprising:
    a substrate having a plurality of solder bumps;
    an integrated circuit die having a plurality of connection bumps each bonded to a respective one of the solder bumps; and
    an underfill between the substrate and the integrated circuit die, the underfill being at least partially filled with filler particles, at least some of the filler particles being electrically conductive;
    wherein the filler particles include non-conductive particles and conductive particles;
    wherein the non-conductive particles do not exceed 50% by volume of the underfill and the conductive particles do not exceed 30% by volume of the underfill.

2. The device of claim 1, wherein the non-conductive particles do not exceed 40% by volume of the underfill.

3. The device of claim 2, wherein the non-conductive particles constitute at least 20% by volume of the underfill, and the conductive particles constitute at least 10% and not more than 20% by volume of the underfill.

4. A device comprising:
    a substrate having a plurality of solder bumps;
    an integrated circuit die having a plurality of connection bumps each bonded to a respective one of the solder bumps; and
    an underfill between the substrate and the integrated circuit die, the underfill being at least partially filled with filler particles, at least some of the filler particles being electrically conductive;

wherein the filler particles include non-conductive particles and conductive particles;
wherein at least some of the non-conductive particles are substantially larger than all of the conductive particles.

5. The device of claim 4, wherein:
the non-conductive particles constitute at least 20% and not more than 40% by volume of the underfill;
the conductive particles constitute at least 10% and not more than 20% by volume of the underfill;
the non-conductive particles are formed of silica;
the conductive particles are formed of one of: (a) a tin-based solder, (b) silver and (c) aluminum; and
the underfill includes diglycidylether of bisphenol F and methylhexahydrophthalic anhydride.

6. The device of claim 1, wherein:
the non-conductive particles include one or more of silica, alumina and boron nitride; and
the conductive particles include at least one of: copper, silver, aluminum, gold, platinum, palladium, beryllium, rhodium, nickel, cobalt, iron, molybdenum, tin, lead, chromium, zinc, magnesium, titanium, bismuth, cadmium, gallium, indium, mercury, antimony, scandium and polonium.

7. The device of claim 1, wherein the conductive particles are formed of a metal alloy or a solder alloy.

8. The device of claim 1, wherein:
the non-conductive particles are formed of silica; and
the conductive particles are formed of one of: a tin-based solder, silver and aluminum.

9. A system comprising:
a die comprising an integrated circuit; and
a chipset in communication with the integrated circuit;
wherein the die comprises a plurality of connection bumps each bonded to a respective one of a plurality of soldier bumps on a substrate, an underfill being present between the substrate and the die, the underfill being at least partially filled with filler particles, at least some of the filler particles being electrically conductive;
wherein the filler particles include non-conductive particles and conductive particles;
wherein:
the non-conductive particles constitute at least 20% and not more than 40% by volume of the composition; and
the conductive particles constitute at least 10% and not more than 20% by volume of the composition.

10. A device comprising:
a substrate having a plurality of bumps;
an die having a plurality of bumps each bonded to a respective one of the bumps of the substrate; and
an underfill between the substrate and the die, the underfill being at least partially filled with filler particles;
wherein the filler particles include non-conductive particles and conductive particles;
wherein the non-conductive particles do not exceed 50% by volume of the underfill and the conductive particles do not exceed 30% by volume of the underfill.

11. The device of claim 10, wherein the non-conductive particles do not exceed 40% by volume of the underfill.

12. The device of claim 11, wherein the non-conductive particles constitute at least 20% by volume of the underfill, and the conductive particles constitute at least 10% and not more than 20% by volume of the underfill.

* * * * *

UNITED STATES PATENT AND TRADEMARK OFFICE
CERTIFICATE OF CORRECTION

PATENT NO. : 6,982,492 B2
DATED : January 3, 2006
INVENTOR(S) : Christopher L. Rumer et al.

It is certified that error appears in the above-identified patent and that said Letters Patent is hereby corrected as shown below:

<u>Column 7, lines 30-34 and Column 8, Lines 1-14,</u>
Insert:
9. A system comprising:
   a die comprising an integrated circuit; and
   a chipset in communication with the integrated circuit;
  wherein the die comprises a plurality of connection bumps each bonded to a respective one of a plurality of solder bumps on a substrate, an underfill being present between the substrate and the die, the underfill being at least partially filled with filler particles, at least some of the filler particles being electrically conductive;
   wherein the filler particles include non-conductive particles and conductive particles;
   wherein:
      the non-conductive particles constitute at least 20% and not more than 40% by volume of the composition; and
      the conductive particles constitute at least 10% and not more than 20% by volume of the composition.

UNITED STATES PATENT AND TRADEMARK OFFICE
CERTIFICATE OF CORRECTION

PATENT NO. : 6,982,492 B2
DATED : January 3, 2006
INVENTOR(S) : Christopher L. Rumer et al.

It is certified that error appears in the above-identified patent and that said Letters Patent is hereby corrected as shown below:

Column 8,
Lines 15-25, insert:
10. A device comprising:
 a substrate having a plurality of bumps;
 a die having a plurality of bumps each bonded to a respective one of the bumps of the substrate; and
 an underfill between the substrate and the die, the underfill being at least partially filled with filler particles;
 wherein the filler particles include non-conductive particles and conductive particles;
 wherein the non-conductive particles do not exceed 50% by volume of the underfill and the conductive particles do not exceed 30% by volume of the underfill.

Signed and Sealed this

Eleventh Day of April, 2006

JON W. DUDAS
*Director of the United States Patent and Trademark Office*